US006818942B2

(12) United States Patent
Tai et al.

(10) Patent No.: US 6,818,942 B2
(45) Date of Patent: Nov. 16, 2004

(54) NON-VOLATILE SEMICONDUCTOR STORAGE DEVICE HAVING CONDUCTIVE LAYER SURROUNDING FLOATING GATE

(75) Inventors: Akira Tai, Okazaki (JP); Shoji Mizuno, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/330,167

(22) Filed: Dec. 30, 2002

(65) Prior Publication Data

US 2003/0136987 A1 Jul. 24, 2003

(30) Foreign Application Priority Data

Jan. 21, 2002 (JP) ........................................ 2002-011560
Nov. 18, 2002 (JP) ........................................ 2002-333774

(51) Int. Cl.[7] .............................................. H01L 29/76
(52) U.S. Cl. ......................... 257/314; 257/315; 257/316
(58) Field of Search ................................. 257/295, 298, 257/314–326

(56) References Cited

U.S. PATENT DOCUMENTS

| | | | |
|---|---|---|---|
| 4,649,520 A | 3/1987 | Eitan | |
| 4,970,565 A | 11/1990 | Wu et al. | |
| 5,016,069 A | * 5/1991 | Bergemont | ................ 357/23.5 |
| 5,107,461 A | 4/1992 | Riva | |
| 5,457,335 A | 10/1995 | Kuroda et al. | |
| 5,640,345 A | * 6/1997 | Okuda et al. | ................ 365/184 |
| 5,747,846 A | 5/1998 | Iida et al. | |
| 6,151,245 A | 11/2000 | Pio et al. | |
| 6,355,527 B1 | * 3/2002 | Lin et al. | ..................... 438/265 |
| 2002/0000605 A1 | * 1/2002 | Liu et al. | ..................... 257/316 |

FOREIGN PATENT DOCUMENTS

| JP | A-1-278781 | 11/1989 |
|---|---|---|
| JP | A-2-2684 | 1/1990 |
| JP | A-2-272775 | 11/1990 |
| JP | A-2-312282 | 12/1990 |

OTHER PUBLICATIONS

Yasushi Kasa etc., "A Partially Programmable ROM", Electronic Information Communication Research Report, SDM90–10–23 (1990): p. 51–54.

* cited by examiner

Primary Examiner—Mary Wilczewski
Assistant Examiner—Monica Lewis
(74) Attorney, Agent, or Firm—Posz & Bethards, PLC

(57) ABSTRACT

In a non-volatile semiconductor storage device, a barrier layer is disposed, via an interlayer isolating film, in an area surrounding a floating gate, including an area adjoining a connecting part of the floating gate, without covering the floating gate. The edge of the barrier layer is, in an overhead view relative to the surface of the semiconductor substrate, disposed at a space of 2 $\mu$m apart from the edge of the floating gate.

20 Claims, 17 Drawing Sheets

NON-VOLATILE SEMICONDUCTOR STORAGE DEVICE HAVING CONDUCTIVE LAYER SURROUNDING FLOATING GATE

CROSS REFERENCE TO RELATED APPLICATIONS

This application is based on and incorporates herein by reference Japanese Patent Applications No. 2002-11560 filed on Jan. 21, 2002 and No. 2002-333774 filed on Nov. 18, 2002.

1. Field of the Invention

The present invention relates to a non-volatile semiconductor storage device in which stored data are erasable has a conductive barrier layer that surrounds a floating gate.

2. Background of the Invention

An erasable programmable read-only memory (EPROM) is of a non-volatile semiconductor storage device whose data can be erased through ultra-violet irradiation. Some EPROMs have a single-layer gate structure and the other EPROMs have a two-layer gate structure. As shown in FIGS. 18A and 18B, an EPROM 101 of a single-layer gate structure has a control gate 5 and a floating gate 9. The control gate 5 is formed of a high-concentrated N-type diffusion layer in a surface layer of a semiconductor substrate 2. The floating gate 9 is formed of poly-silicon and others on a gate oxidation film 8 in the surface layer of a semiconductor substrate 2. A P-type well 4a is formed on a P⁻-type substrate 3. A drain region 16 and a source region 17 formed within the surface layer of the P-type well 4a are respectively disposed to adjoin both sides of the floating gate 9. An interlayer isolating film 10 of BPSG or the like and a passivation film (not shown) are formed over the semiconductor substrate 2 that includes the floating gate 9.

In the EPROM 101, threshold voltage variation $\Delta Vt$ of a data-unwritten cell transistor (unwritten transistor) has a tendency of increasing with electric current supply time (consecutive reading time) as shown in FIG. 19. The tendency is remarkable in high temperature range exceeding 80° C. The same tendency is found in EPROMs that have different material or thickness of isolating layers such as the interlayer isolating film 10. The EPROM having this tendency thereby is not used as storage device for consecutive reading at a high temperature due to the threshold voltage variation $\Delta Vt$ of the unwritten transistor.

The reason for the transistor threshold voltage variation $\Delta Vt$ is assumed as follows. Since the semiconductor substrate 2 is set to ground (GND) potential, voltage is applied to the control gate 5 and the drain region 16 during the reading. This affects the floating gate 9, to which is thereby also applied the voltage. As shown in FIG. 20, electric potential contour lines (same electric potential lines) form numerous concentric arcs centering around the floating gate 9 and electric flux lines thereby arise from the floating gate 9. Electric charge centers into the floating gate 9 from a surrounding area such as the interlayer isolating film 10. This probably results in the threshold voltage variation $\Delta Vt$ of the unwritten transistor during the consecutive reading at the high temperature.

An EPROM 102 shown in FIGS. 21A and 21B is adopted for preventing the electric charge from centering into the floating gate 9. In the EPROM 102, the floating gate 9 is covered with a metal wiring layer 30 using aluminum or others, and other structures are the same as that of the EPROM 101. This EPROM is disclosed in U.S. Pat. No. 5,457,335 (JP-P3083547) and JP-A-H01-278781.

As shown in FIG. 19, the EPROM 102 has a smaller increase of the transistor threshold voltage variation $\Delta Vt$ relative to the electric current supply time (consecutive reading time) than the EPROM 101. The metal wiring layer 30 in the EPROM 102 is electrically connected with the control gate 5 (not shown), so that the metal wiring layer 30 is applied the voltage to during the reading.

As shown in FIG. 22, electric potential contour lines form numerous concentric arcs centering around the metal wiring layer 30. The electric flux lines thereby arise from the metal wiring layer 30 instead of the floating gate 9. Since the metal wiring layer 30 thus works as a barrier layer, the electric charge is assumed to be interrupted from centering into the floating gate 9.

On the other hand, in EPROM manufacturing, a writing inspection to an entire EPROM and a retaining inspection to all written data are executed. All the data written and retained in the EPROM during the inspections are hence erased before product shipment in an erasing process which adopts ultra-violet irradiation on the floating gate 9. However, since the floating gate 9 in the EPROM 102 is covered with the metal wiring layer 30, the ultra-violet irradiation amount to the floating gate 9 is limited by the metal wiring layer 30.

In FIG. 23 showing relationship between ultra-violet irradiation time and transistor threshold voltage Vt, erasure of the data is completed when the transistor threshold voltage Vt decreases to approach a constant value. As shown in the results, the EPROM 102 requires more irradiation time for the erasure than the EPROM 101, which problem leads to lowering productivity in the EPROM 102 manufacturing.

The above problem in the single-layer gate structured EPROM, involving longer erasure time, is also experienced in the two-layer gate structured EPROM where a floating gate is not covered by a control gate. In addition, the same problem is found in an electrically erasable and programmable read only memory (EEPROM) that has the same structure as the EPROM 102. Since, in EEPROM manufacturing, a writing/erasing inspection and a retaining inspection to all the written data are executed, all the data written and retained in the EEPROM during the inspections must be also erased before product shipment.

SUMMARY OF THE INVENTION

It is an object of the present invention to provide a non-volatile semiconductor storage device whose structure suppresses threshold voltage variation of unwritten transistor during consecutive reading at high temperatures, without increasing ultra-violet irradiation time required for erasing stored data.

To achieve the above and other objects, a non-volatile semiconductor storage device is provided with a floating gate, an isolating layer, and a conductive layer as follows.

The isolating film is formed on the floating gate. The conductive layer is formed on the isolating film and is for suppressing variation of electric potential in the floating gate. The conductive layer is formed over an area surrounding the floating gate, with uncovering the floating gate.

The conductive layer hence does not cover the floating gate, so that ultra-violet irradiation to the floating gate is not interrupted. This results in no increase of the ultra-violet irradiation time required for erasing stored data. In addition, even when electric potential difference arises between the floating gate and an area surrounding the floating gate, the conductive layer can interrupt electric flux lines generated from the electric potential difference. This results in suppressing threshold voltage variation of unwritten transistor during consecutive reading at a high temperature.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
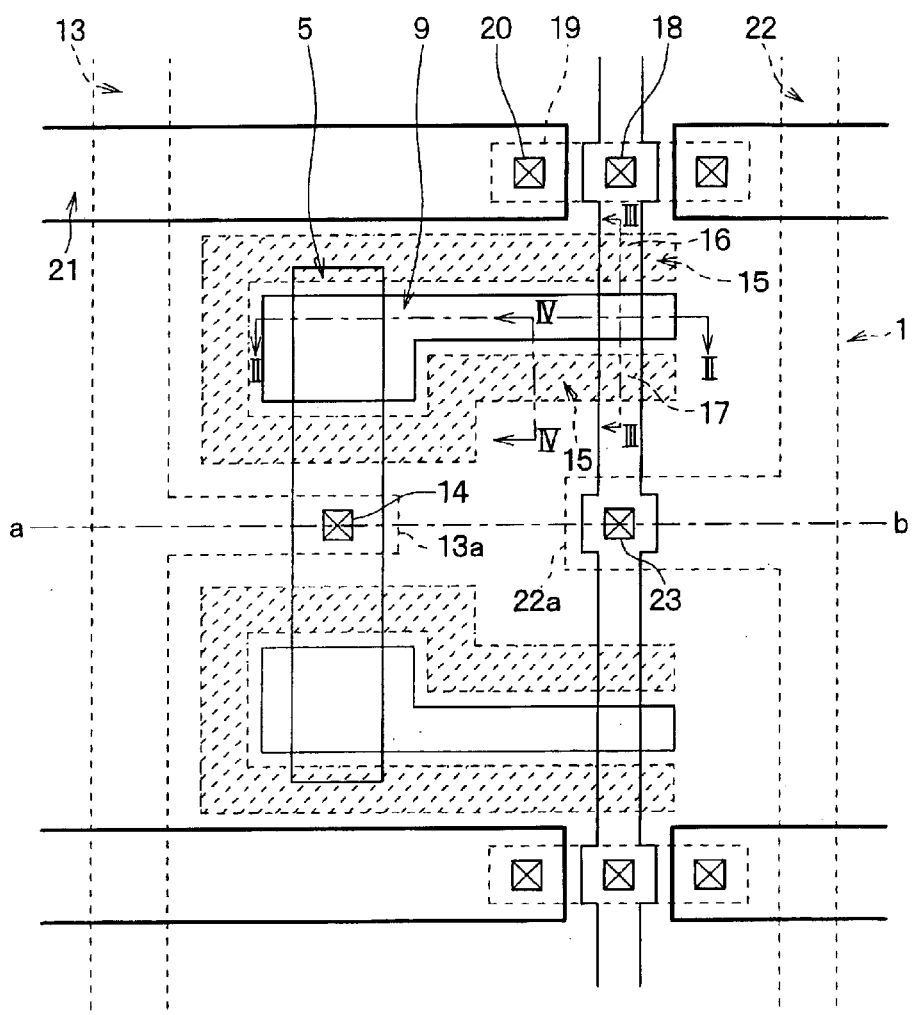
FIG. 1 is a plan view of an EPROM of a non-volatile semiconductor storage device according to a first embodiment of the present invention.

Two memory cells of an erasable programmable read-only memory (EPROM) 1 are shown in an upper and lower parts relative to a chain line a–b in FIG. 1. The upper memory cell structure will be explained hereunder.

Figure 2:
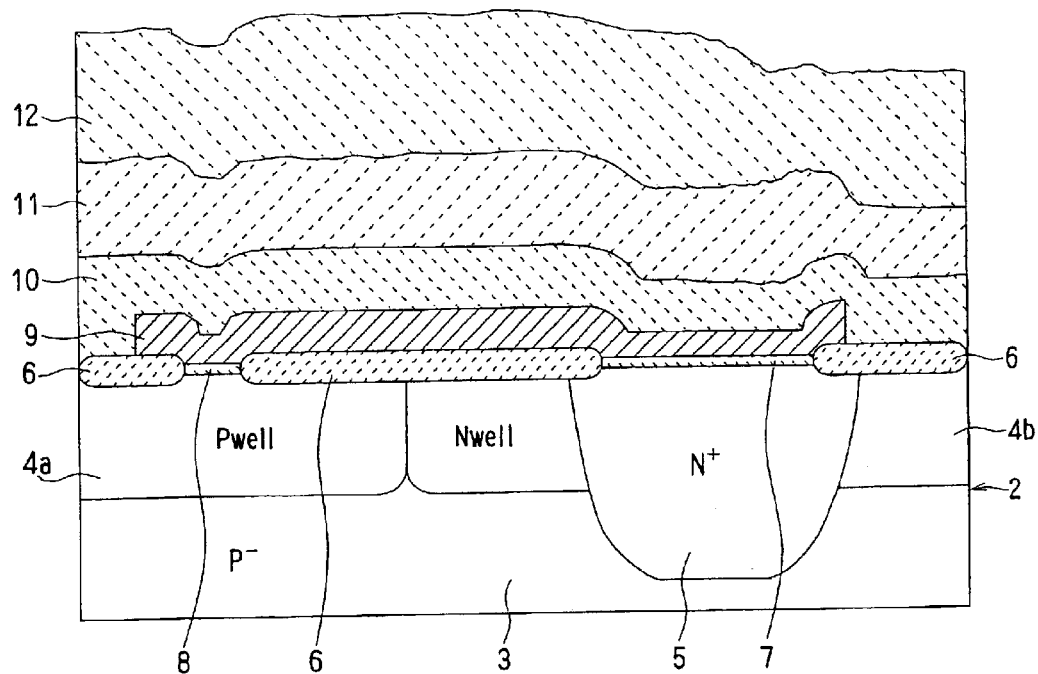
FIG. 2 is a sectional view taken along a line II—II in FIG. 1.

A semiconductor substrate 2 is equipped with, on a P⁻-type substrate 3, a P-type well layer 4a and an N-type well layer 4b as shown in FIG. 2. A control gate 5 is formed of high-concentrated N-type diffusion layer within the N-type well layer 4b and P⁻-type substrate 3.

A field oxidation film 6 as an isolating layer is formed on the P-type well layer 4a and N-type well layer 4b. The field oxidation film 6 has opening in a region on a part of the P-type well 4a and a region on a part of the control gate 5 within the N-type well layer 4b. In this opening, gate isolating films 8, 7 are formed on the above regions, respectively.

A floating gate 9 is formed on the gate isolating films 7, 8, overstriding the field oxidation film 6. An interlayer isolating film 10 as the first isolating film is formed of, e.g., BPSG on the floating gate 9. An isolating film 11 as the second isolating film is then formed of TEOS film or the like on the interlayer isolating film 10. A protection film 12 is finally formed of, e.g., P-SiN as the uppermost layer of the semiconductor substrate 2.

A region shown by a dotted line in FIG. 1 is the first metal wiring layer, which is disposed between the interlayer film 10 and isolating film 11 shown in FIG. 2. A region shown by a bold solid line in FIG. 1 is the second metal wiring layer, which is disposed above the first wiring layer between the isolating film 11 and protection film 12 shown in FIG. 2.

The control gate 5 is formed in a rectangle having longitudinal edges vertically in FIG. 1. A word line 13 made of Al or the like is included in the first metal wiring layer and is formed in parallel with the control gate 5, vertically in FIG. 1. A part 13a of the word line 13 extends rightward along the chain line a–b in FIG. 1 to overlap with the control gate 5. The control gate 5 is electrically connected with the word line 13 through a contact 14.

The floating gate 9 is formed to extend in parallel with the chain line a–b. The leftward region of the floating gate 9 that overlaps with the control gate 5 is larger than the rightward region that is shaped in a rectangle having longitudinal edges horizontally in FIG. 1. Here, the floating gate 9 is electrically connected with none of electrodes to be isolated.

A barrier layer 15 is disposed in a region that is surrounded with dotted lines and hatched with dotted lines in FIG. 1. The barrier layer 15 uncovers the floating gate 9 and almost surrounds the floating gate 9 with adjoining a plurality of the edges, excluding the rightmost edge in FIG. 1, of the floating gate 9. The barrier layer 15 is formed of Al or the like with being disconnected with any electrodes to be electrically isolated.

Figure 3:
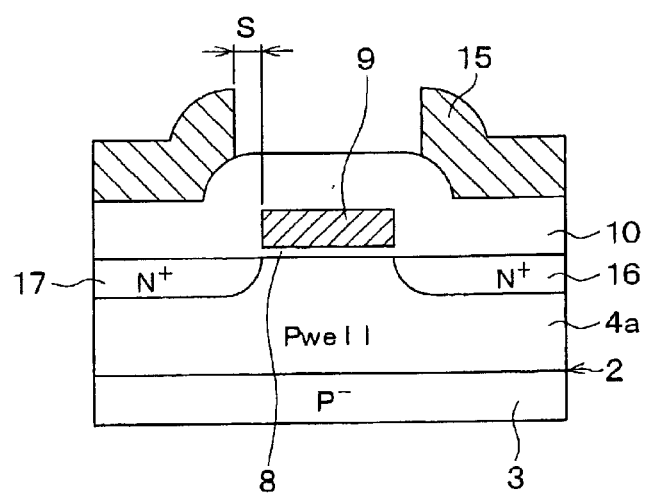
FIG. 3 is a sectional view taken along a line III—III in FIG. 1.

The barrier layer 15 included in the first metal wiring layer is formed on the interlayer film 10 as shown in FIG. 3. Here, a space S is between the adjoining edges of the barrier layer 15 and floating gate 9, in an overhead view relative to the surface of the semiconductor substrate 2. That is, the space is defined as a distance between vertical planes of the adjoining edges of the barrier layer 15 and floating gate 9, assuming that the surface of the semiconductor substrate 2 is located horizontally. The space is 0.5 μm in this embodiment.

A sectional view in the FIG. 3 shows a region where a transistor is formed. A drain region 16 and a source region 17 are thus formed to be located in two opposed sides of the floating gate 9 within the surface layer of the semiconductor substrate 2. The drain and source regions 16, 17 are composed of the N-type diffusion layer that is formed vertically in FIG. 1 to intersect with the floating gate 9 in the close vicinity of the rightmost edge of the floating gate 9. The N-type diffusion layer is not formed under the floating gate 9 shown in FIG. 3 since it is formed through ion implantation by masking the floating gate 9.

The drain region 16 is connected via a contact 18 with a first Al wiring 19 included in the first metal wiring layer that is formed on the interlayer isolating film 10. The first Al wiring 19 is electrically connected via a contact 20 with a data line 21 included in the second metal wiring layer that is formed in parallel with the chain line a–b, horizontally in FIG. 1.

By contrast, the source region 17 is electrically connected via a contact 23 with a part 22a of a source line 22. The source line 22 is formed as shown in vertical dotted lines in FIG. 1. The connected part 22a of the source line 22 is formed in parallel with the chain line a–b.

The EPROM 1 of the present embodiment is equipped with a plurality of the memory cells, one of which is explained above as the upper memory cell among the two cells in FIG. 1.

In data writing operation, application of electric voltage to the drain 16 of the transistor region causes a hot carrier. Simultaneous application of electric voltage to the control gate 5 enables the floating gate 9 to be injected with a carrier. A threshold value of the transistor threshold voltage Vt is thereby changed to a greater value than an initial value. In data reading operation, by applying a voltage between a data-unwritten cell transistor (unwritten transistor) threshold voltage Vt and a data-written cell transistor (written transistor) threshold voltage Vt, 'on' or 'off' state of the transistor is detected, so that '0' or '1' is determined, respectively.

Figure 4:
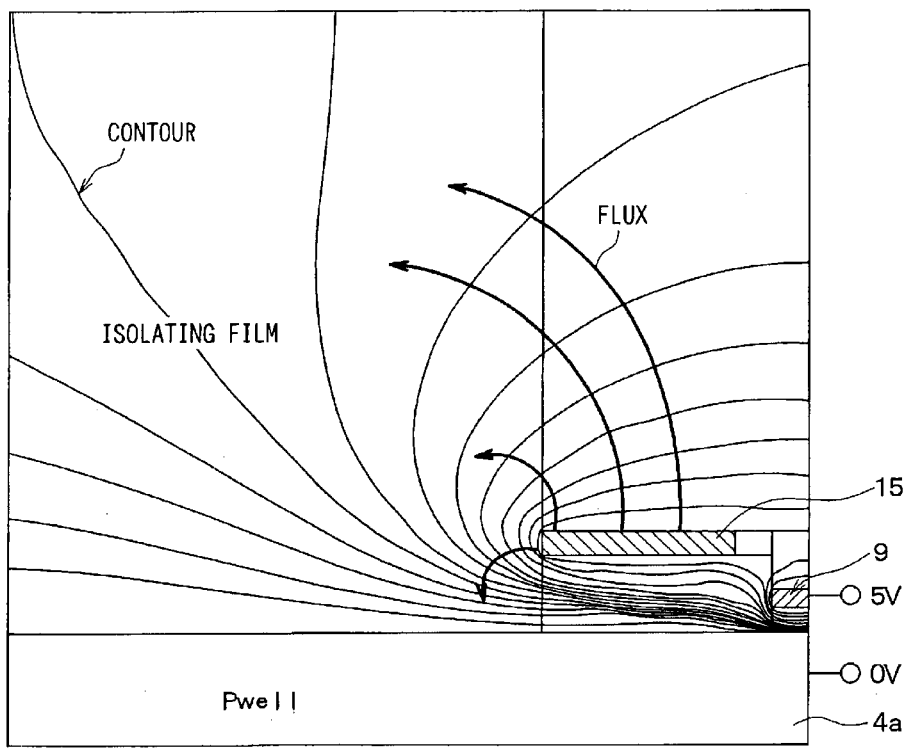
FIG. 4 is a graph showing a simulation result of electric potential distribution in a section taken along a line IV-IV in FIG. 1.

Referring to FIG. 4, electric potential distribution in the reading operation will be explained. In the present embodiment, the barrier layer 15 is disposed near the floating gate 9. The electric flux lines thereby arise from the barrier layer 15 toward an area surrounding the barrier layer 15 even when there is voltage difference between the floating gate 9 and an area surrounding the floating gate 9.

Namely, the barrier layer 15 interrupts the electric flux lines between the floating gate 9 and the isolating films surrounding the floating gate 9. Electric charge to the floating gate 9 is thereby prevented, so that electric potential variation of the floating gate 9 is suppressed in the reading operation. This results in lowering transistor threshold voltage variation ΔVt of an unwritten transistor even in the consecutive reading at high temperatures.

Figure 5:
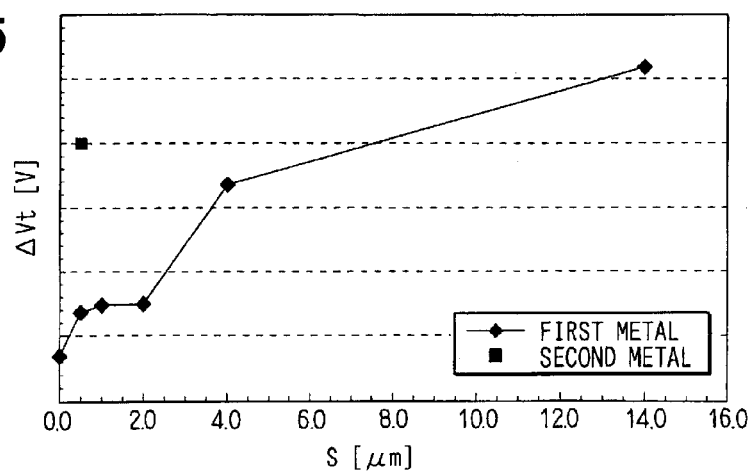
FIG. 5 is a graph showing relationship between a space and transistor threshold voltage variation ΔVt after one hour electric current supply.
Figure 19:
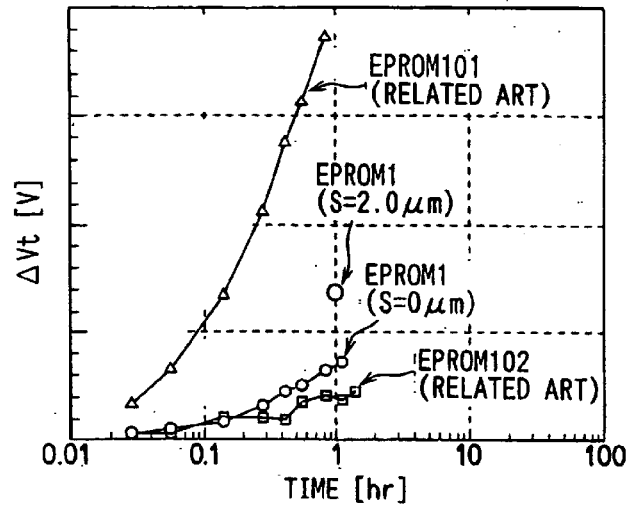
FIG. 19 is a graph showing relationship between consecutive reading time and unwritten transistor threshold voltage variation ΔVt.
Figure 20:
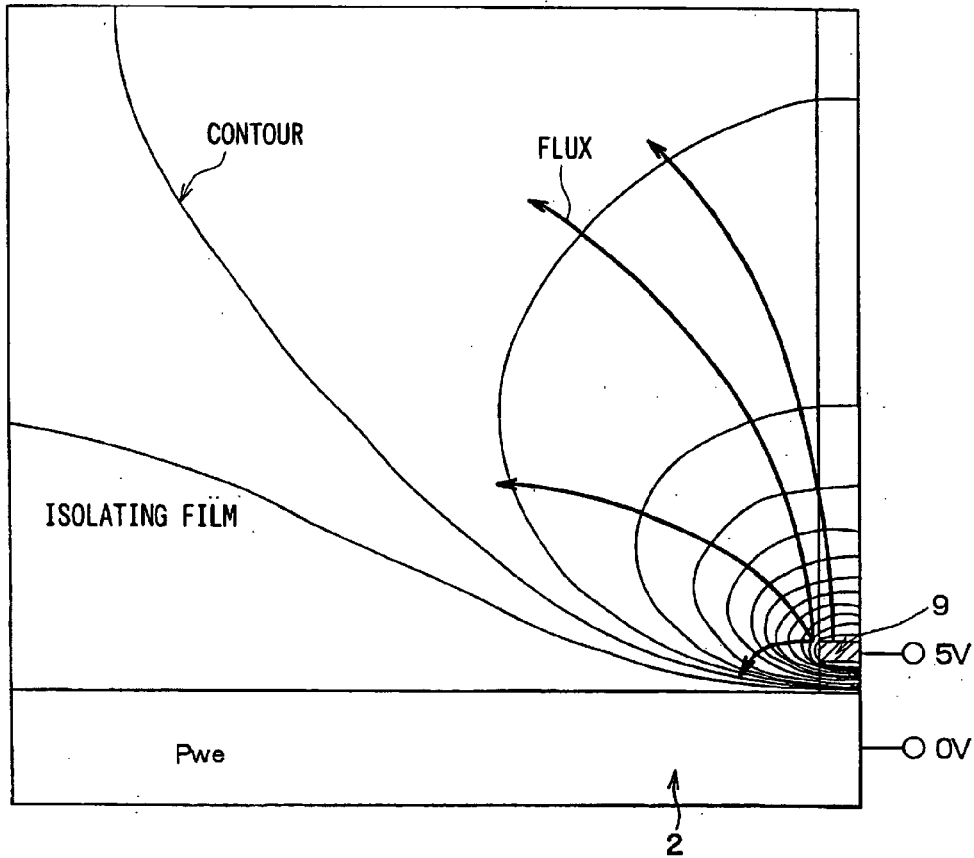
FIG. 20 is a graph showing a simulation result of electric potential distribution in a section along a line XX—XX in FIG. 18A.
Figure 21A:
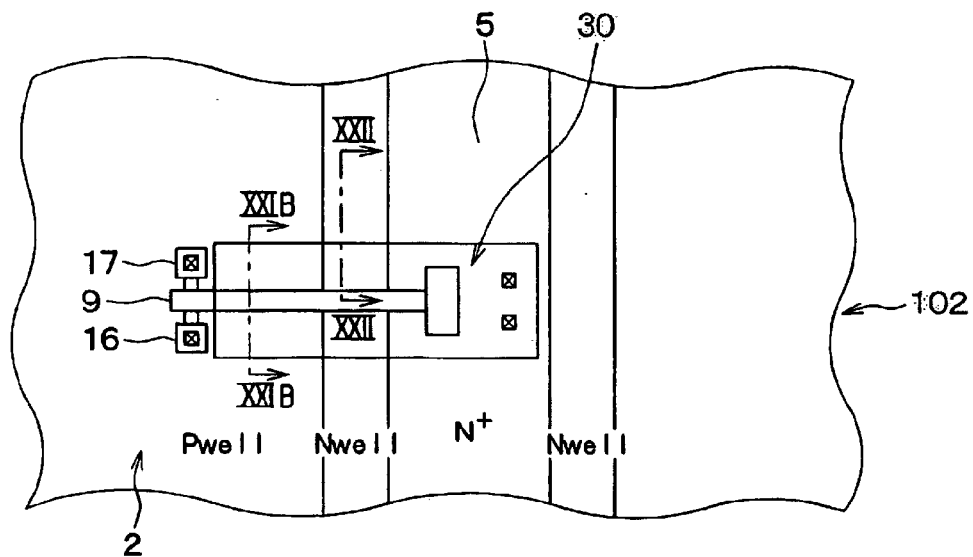
FIG. 21A is a plan view of another EPROM of the prior art.
Figure 21B:
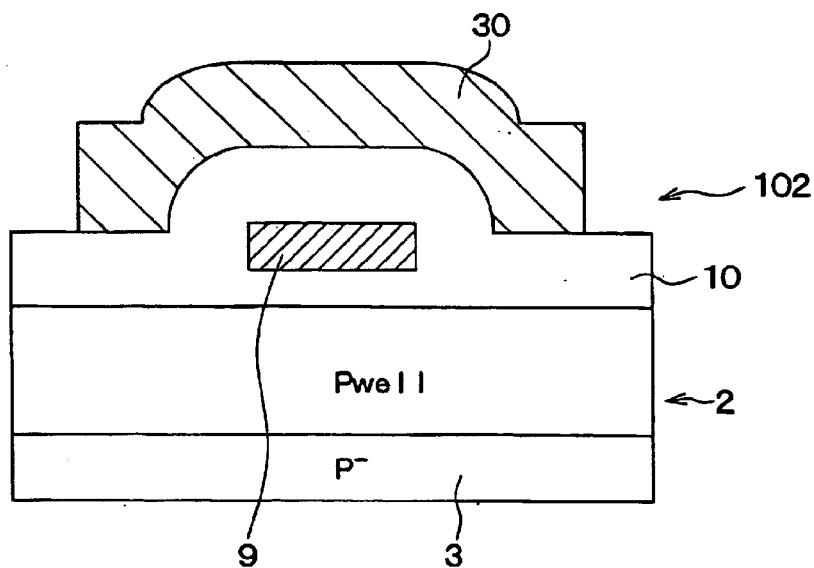
FIG. 21B is a sectional view of the EPROM taken along a line XXIB—XXIB in FIG. 21A.
Figure 22:
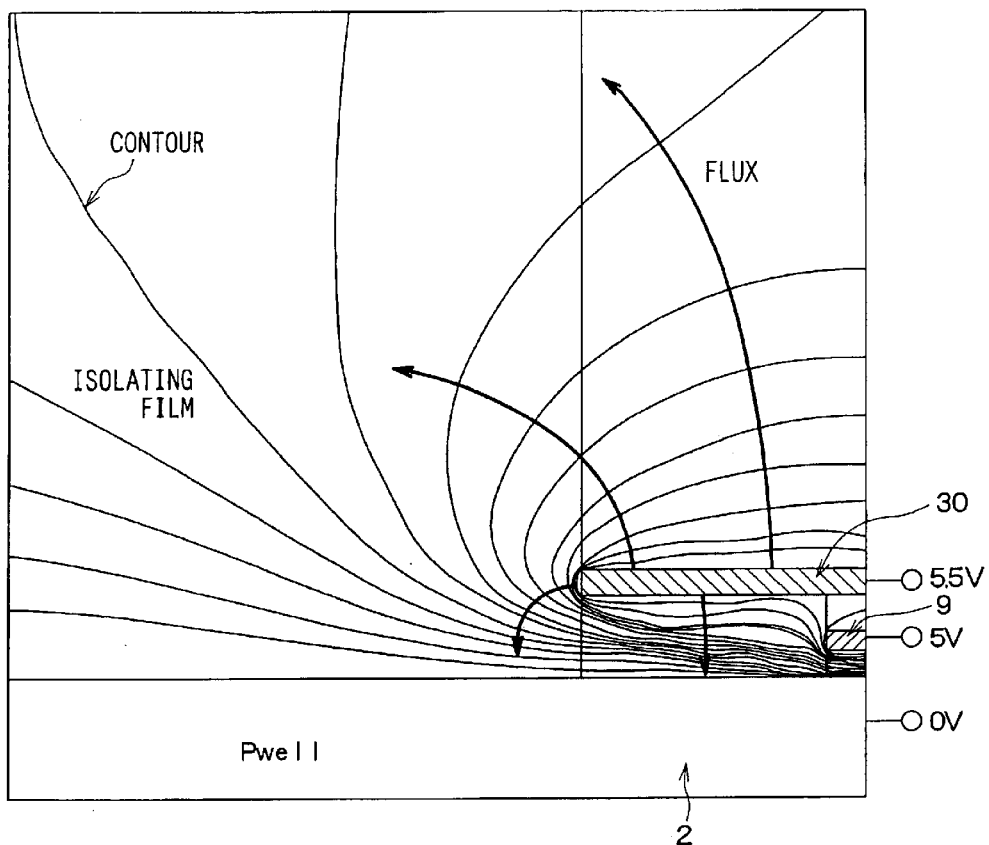
FIG. 22 is a graph showing a simulation result of electric potential distribution in a section along a line XXII—XXII in FIG. 21A.
Figure 23:
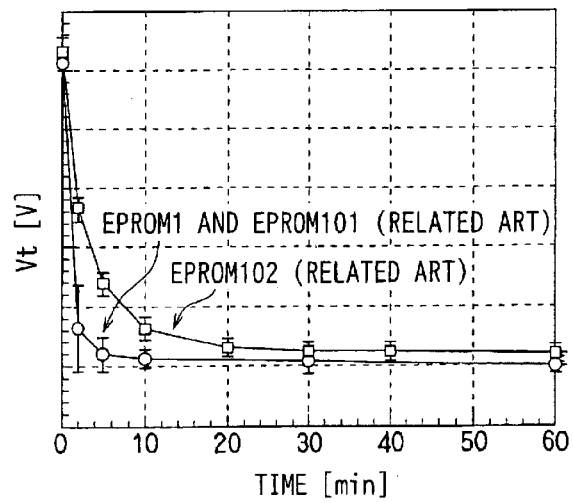
FIG. 23 is a graph showing relationship between ultraviolet irradiation time and unwritten transistor threshold voltage Vt.

In FIG. 5, transistor threshold voltage variation ΔVt after one hour electric current supply is shown relatively to the space S (shown in FIG. 3) between the edges of the barrier layer 15 and floating gate 9. This results from the same condition as shown in FIG. 19, condition which includes the same certain temperature more than 80° C. and the same material of the interlayer isolating film or the like. From the results of the first metal wiring layer, the transistor threshold voltage variation ΔVt remarkably increases from the space S exceeding 2.0 μm, which tendency is also found from the results at any temperature more than 80° C. The space S should be hence within a range between 0 and 2.0 μm.

In FIG. 19, relation between transistor threshold voltage variation ΔVt and electric current supply time (consecutive reading time) is shown regarding the EPROM 1 of the embodiment along with related EPROMs 101 and 102. Two-type results of the EPROM 1 having two spaces S, 0 μm and 2.0 μm are shown. At one hour electric current supply, two results (ΔVt) of the EPROM 1 are smaller than that of the EPROM 101 and close to that of the EPROM 102.

The barrier layer 15 explained above is disposed in the first metal wiring layer. When the barrier layer 15 is disposed in the second metal wiring layer instead of the first metal wiring layer, the transistor threshold voltage variation ΔVt is, at the same space S of 0.5 μm, greater than that in the first metal wiring layer as shown in FIG. 5. It indicates that the effect of the barrier layer 15 decreases with increasing distance from the floating gate 9. In the embodiment, the barrier layer 15 is thereby disposed between the interlayer isolating film 10 and the isolating film 11.

Uncovering the floating gate 9 by the barrier layer 15 prevents an ultra-violet-erasure characteristic from being worsened. The EPROM 1 of the present embodiment thereby does not lower productivity, and its high reliability at high temperature operation leads to availability in, e.g., an in-vehicle storage device for adjusted data of automobile sensor outputs.

In the embodiment, the barrier layer 15 is not disposed between the floating gate 9 and a source electrode. A spacing area between the barrier layer 15 and the source electrode is thereby not necessary for preventing contact with each other. An EPROM size is thus not enlarged. In FIG. 1, the barrier layer 15 is not formed only in a region adjoining the shortest edge of the floating gate 9, so that it still surrounds almost all edges of the floating gate 9. The floating gate 9 is thereby prevented from suffering the current charge from the surrounding area.

Figure 6:
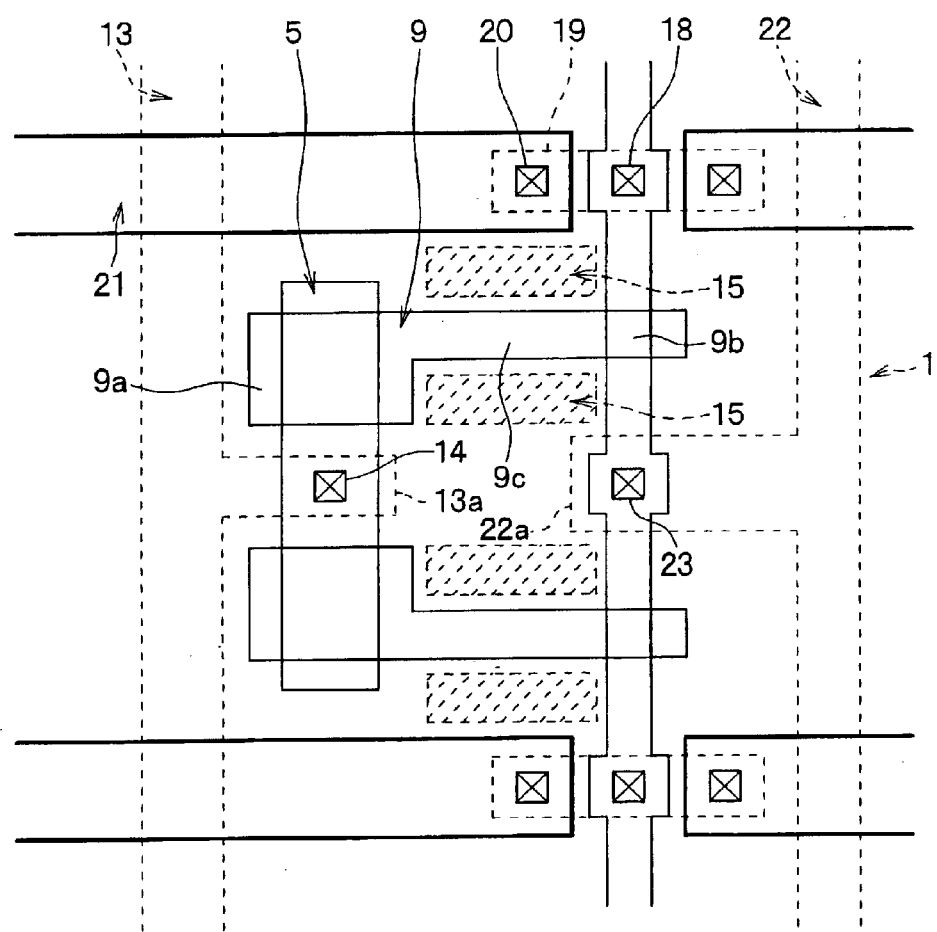
FIG. 6 is a plan view of a first modification example of FIG. 1.

FIG. 6 shows a barrier layer layout for preventing the EPROM size enlargement. A connecting region 9c is located between a leftward region 9a where the floating gate 9 and control gate 5 are overlapped and a rightward region 9b formed in a transistor region. The barrier layer 15 can be disposed only in a region adjoining the connection region 9c, since the region adjoining the connecting region 9c is normally the largest among regions surrounding the floating gate 9.

Figure 7:
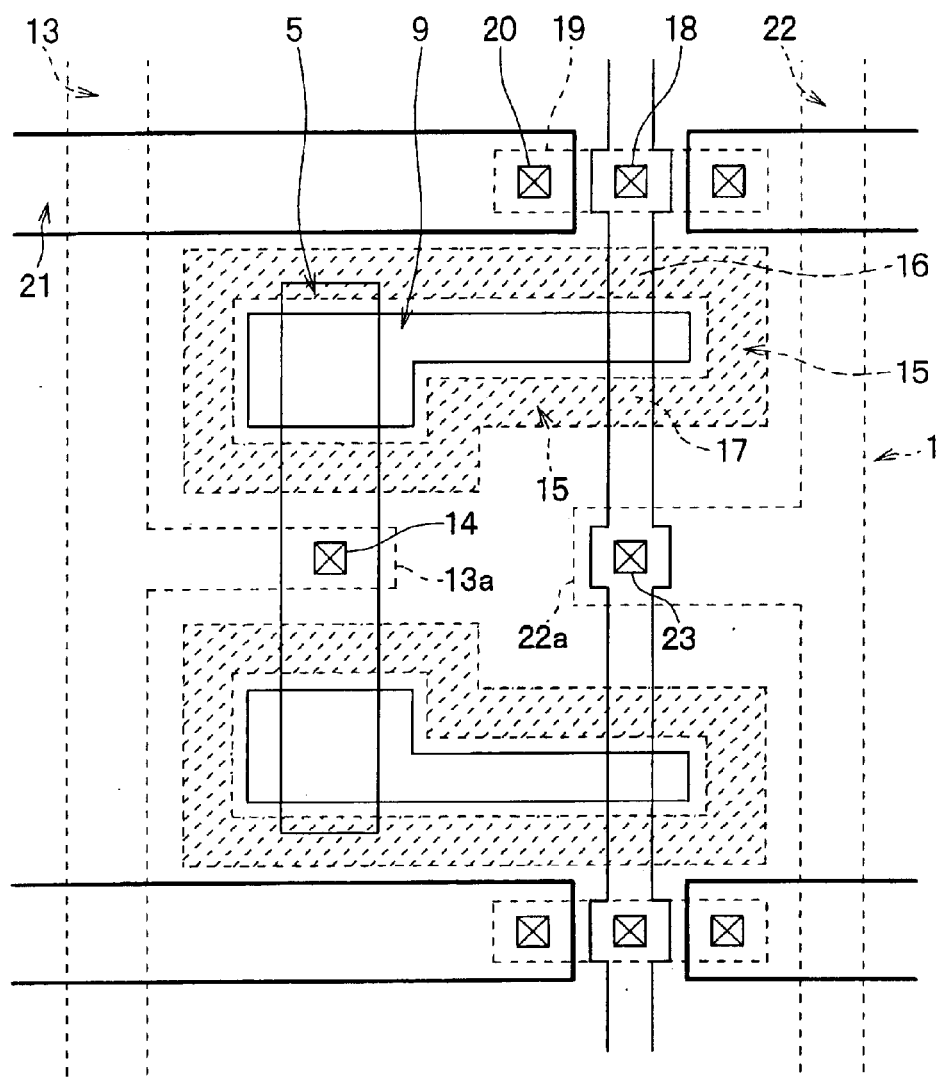
FIG. 7 is a plan view of a second modification example of FIG. 1.

In FIG. 7, the barrier layer 15 surrounds an entire perimeter of the floating gate 9. Although entire surrounding of the floating gate 9 causes enlargement of the EPROM size, the unwritten transistor threshold voltage variation ΔVt at consecutive reading at high temperatures can be suppressed most effectively in comparison with that of the other barrier layer layouts explained above.

Second Embodiment

Figure 8:
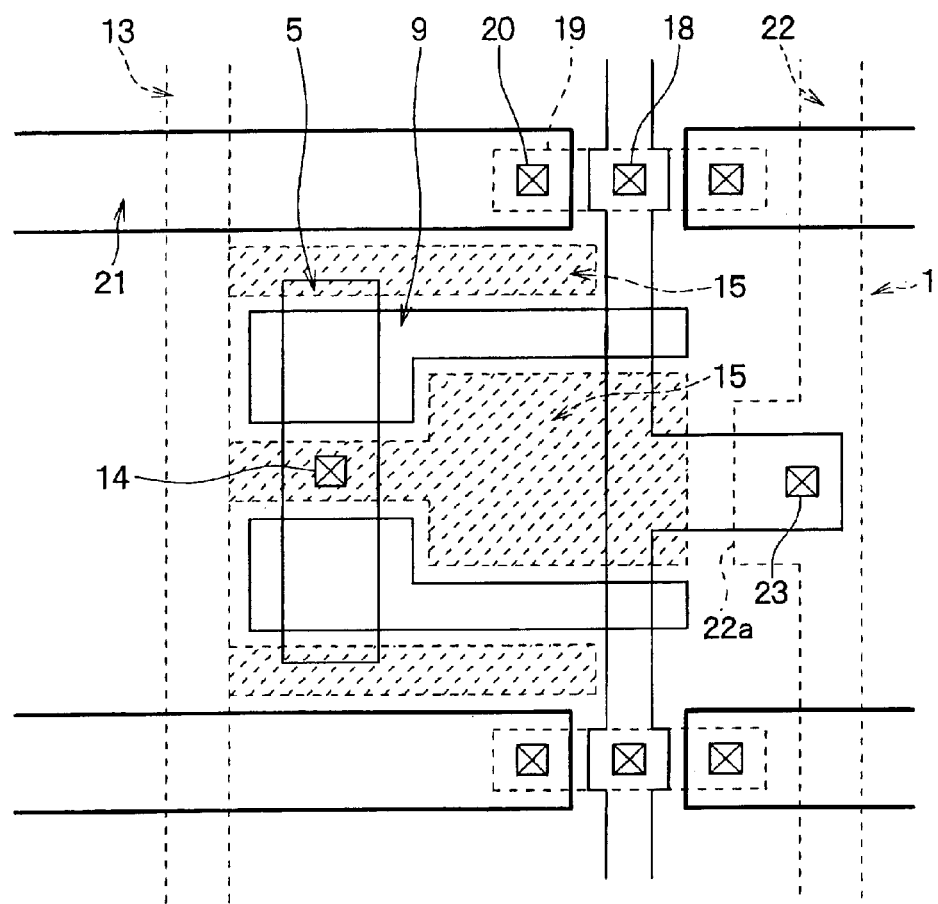
FIG. 8 is a plan view of an EPROM of a non-volatile semiconductor storage device according to a second embodiment.

In the second embodiment, as shown in FIG. 8, the barrier layer 15 is electrically connected with the word line 13, while in the first embodiment the barrier layer 15 is electrically disconnected with any electrodes to be electrically isolated. The barrier layer 15 is formed rightward from the word line 13 along the floating gate 9. In addition, the barrier layer 15 can be connected with the source line 22 (GND potential, not shown).

In the second embodiment, similarly to the first embodiment, the barrier layer 15 should uncover the floating gate 9, and the space S between the vertical planes of the adjoining edges of the floating gate 9 and barrier layer 15 should be not more than 2 μm. The second embodiment hence exhibits the same effects as the first embodiment.

Furthermore, as combination of the first and second embodiments, the barrier layer 15 can have two regions, one of which is electrically isolated and the other is electrically connected with the word line 13.

Third Embodiment

Figure 9:
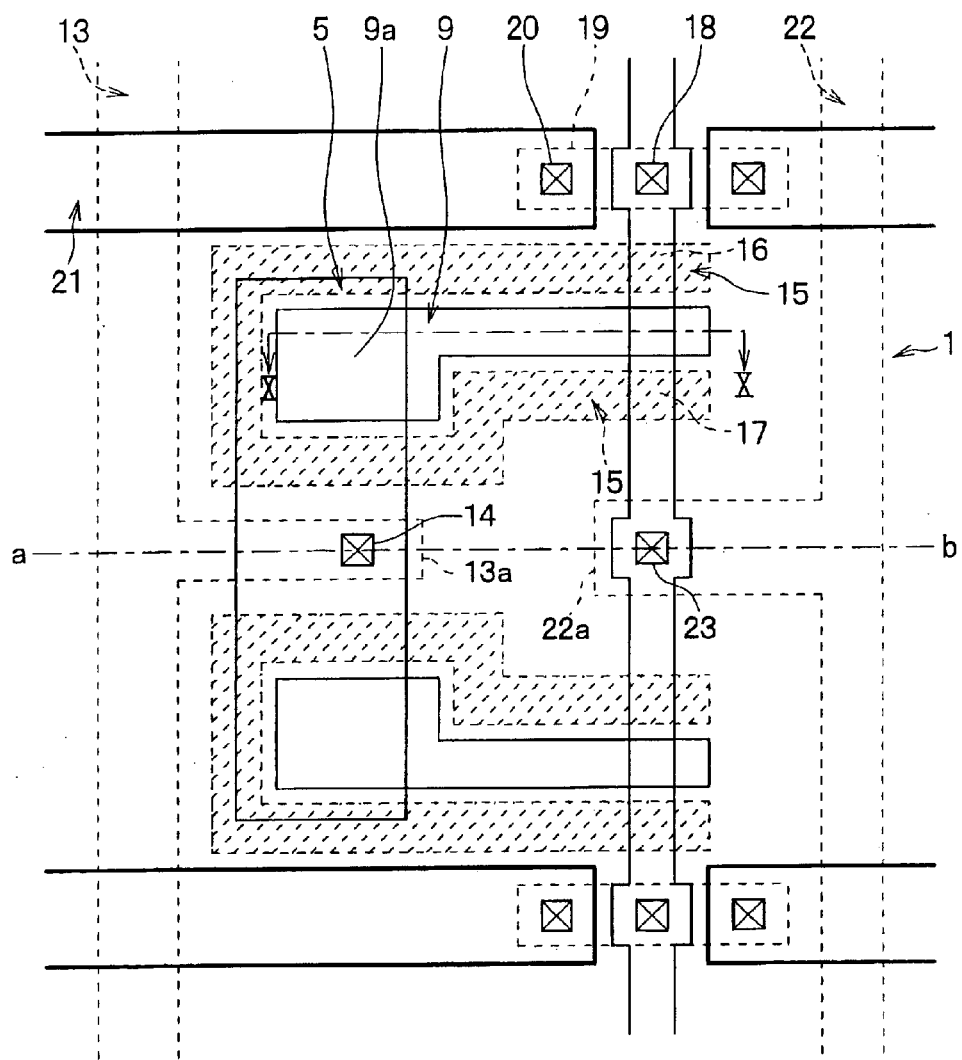
FIG. 9 is a plan view of an EPROM according to a first example of a third embodiment.

In the third embodiment, as shown in FIG. 9, the control gate 5 is composed of poly-silicon, while in the first and second embodiments it is composed of an impurity diffusion layer. The EPROM layout of this embodiment has the same structure as that in FIG. 1 except for the larger control gate region.

Figure 10:
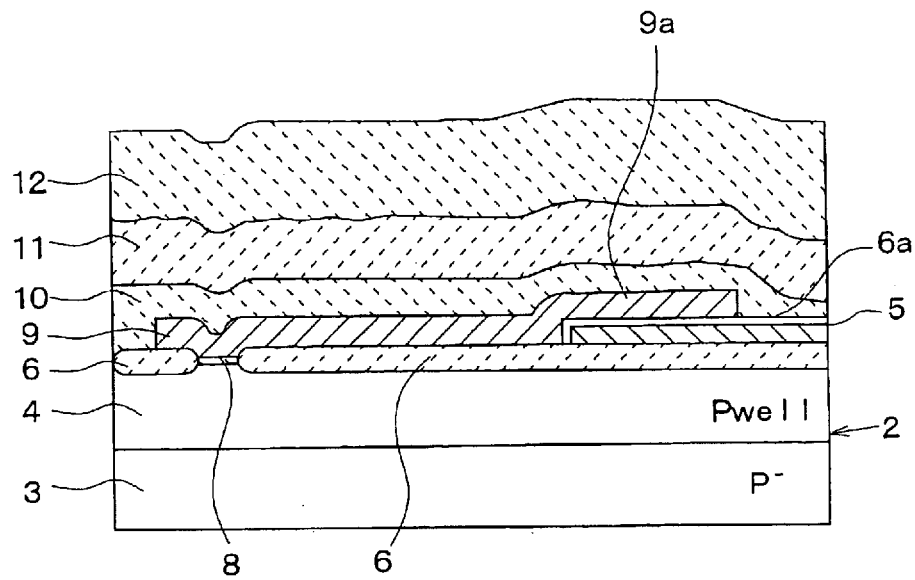
FIG. 10 is a sectional view taken along a line X—X in FIG. 9.
Figure 11:
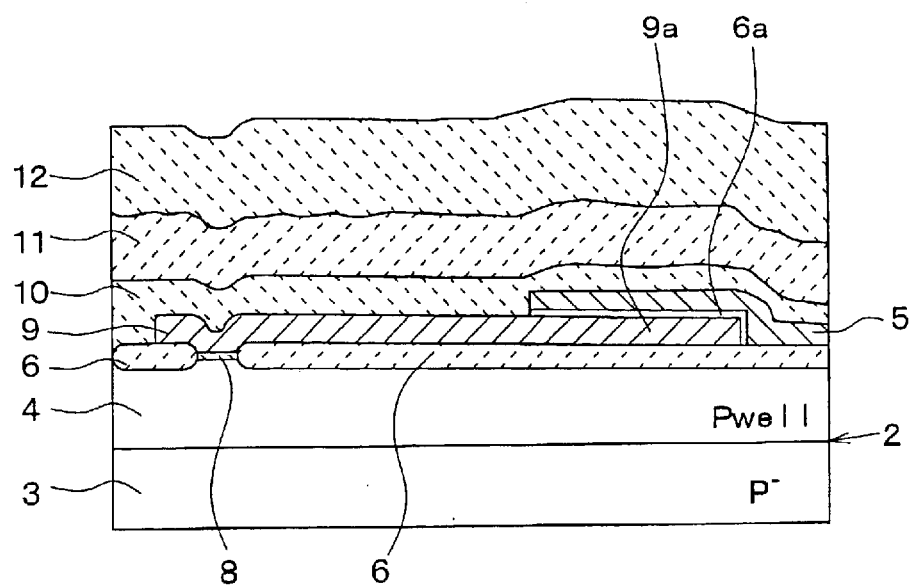
FIG. 11 is a sectional view taken along a line X—X in FIG. 9 according to a second example of the third embodiment.

The control gate 5 is formed of the poly-silicon on the field oxidation film 6 as shown in FIG. 10. In a region where the control gate 5 is overlapped by the floating gate 9, 9a, the isolating film 6a is inserted therebetween. In contrast, the control gate 5 can overlap the floating gate 9 via the isolating film 6a as shown in FIG. 11. Here, the control gate 5 covers only a part of the floating gate 9. Other parts of the structure in FIGS. 10 and 11 are the same as in FIG. 2.

The control gate formation with the poly-silicon can be also applied to the layouts shown in FIGS. 6 and 7 of the first embodiment in addition to the layout shown in FIG. 1. As long as all the floating gate 9 is not covered with the control gate 5, difference in the control gate formation has no influence on the effects explained in the first embodiment.

When the control gate 5 is formed of the high-concentrated N-type diffusion layer to form PN junction with the P-type well layer 4a, the PN junction is apt to be broken down even through application of low voltage. The low-concentrated N-type well layer 4b is therefore provided between the P-type well 4a and the control gate 5 for enhancing withstand voltage as shown in FIG. 2 of the first embodiment.

In contrast, in the third embodiment, the control gate 9 is not formed of the high-concentrated N-type diffusion layer, so that the above low-concentrated N-type well layer 4b is not needed to be disposed. A space between the P-type well 4a and the control gate 5 can be therefore eliminated. The control gate formation with the poly-silicon hence reduces a necessary cell area in comparison to that with the impurity diffusion layer employed in the first and second embodiments.

Fourth Embodiment

The fourth embodiment is directed to an electronically erasable and programmable read only memory (EEPROM) in which the floating gate 9 is uncovered by the control gate 5.

Figure 12:
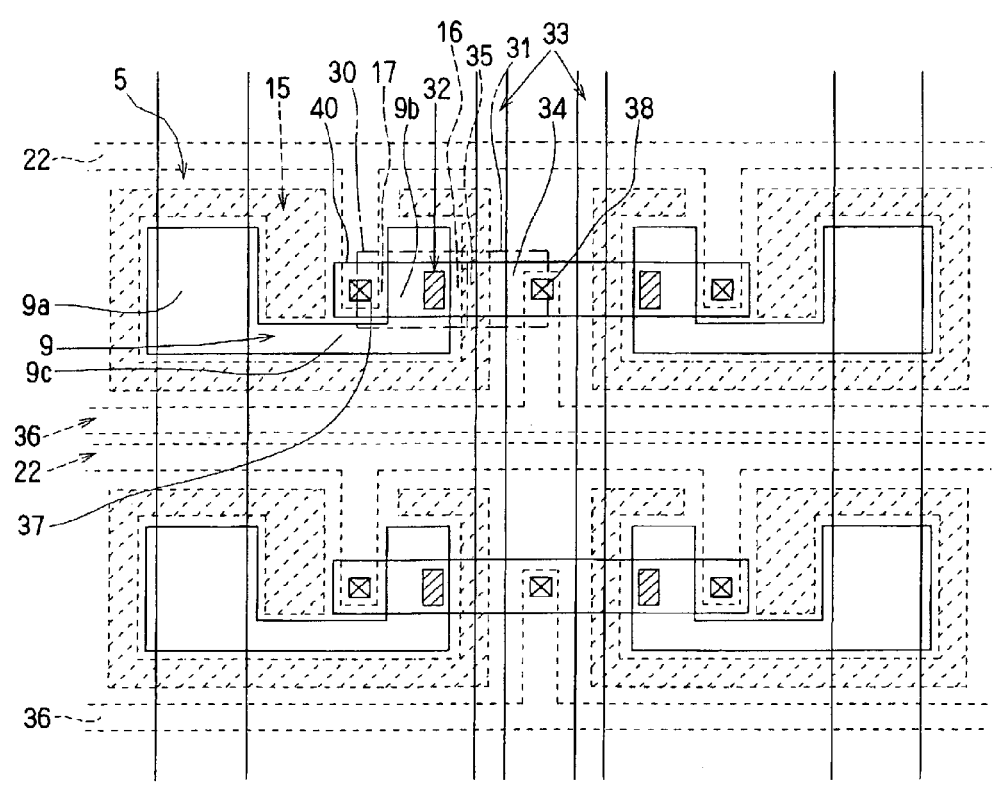
FIG. 12 is a plan view of an EEPROM according to a first example of a fourth embodiment.

Referring to FIG. 12, a region 40 is an N-type diffusion layer formed in the surface layer of the semiconductor substrate. Regions 15, 22, 36 shown in dotted lines are included in the first metal wiring layer similarly to the first embodiment, and the first metal wiring layer is disposed between the interlayer film 10 and isolating film 11 similarly to the structure shown in FIG. 2.

The EEPROM has a memory transistor region 30 and a selective transistor region 31 as shown in FIG. 12. In the memory transistor region 30, the control gate 5, floating gate 9, and a tunnel film 32 are formed. Within the semiconductor substrate 2, the drain region 16 and the source region 17 are formed along both sides of the floating gate 9. In the selective transistor region 31, a gate electrode 33 is formed and a drain region 34 and a source region 35 are formed along both sides of the gate electrode 33.

The EEPROM structure (not shown) is generally the same as that of the first embodiment shown in FIG. 2. The control gate 5 is formed of the high-concentrated N-type diffusion layer in the surface layer of the semiconductor substrate 2, being electrically connected with the word line (not shown).

The tunnel film 32 is formed on the semiconductor substrate 2 as a substitute for the gate oxidation film 8. The floating gate 9 and the gate electrode 33 are disposed on the tunnel film 32 and field oxidation film 6. The interlayer isolating film 10 is formed on the floating gate 9 and gate electrode 33. Furthermore, the barrier layer 15, the source line 22, and a bit line 36 are disposed on the interlayer isolating film 10. The source line 22 is electrically connected with the source region 17 via a contact 37, and the bit line 36 is electrically connected with the drain region 34 of the selective transistor region 31 via a contact 38.

As shown in FIG. 12, the barrier layer 15 is disposed in a region surrounding the floating gate 9, region which excludes a part of the region where the source line 22 is formed. The barrier layer 15 on the interlayer isolating film 10 thus uncovers the floating gate 9. The space S between the edges of the barrier layer 15 and floating gate 9, in the overhead view relative to the surface of the semiconductor substrate 2, measures between 0 and 2 μm similarly to that in the first embodiment. The isolating film 11 and the protection film 12 are further formed on the barrier layer 15, source line 22, and bit line 36.

In this embodiment, in the EEPROM of the single-layer gate structure where the floating gate 9 is uncovered by the control gate 5, the barrier layer 15 and the source line 22 are disposed in the region surrounds the floating gate 9. This embodiment therefore has the same effects as the first embodiment.

The control gate 5 can be formed of the poly-silicon that is substituted for the impurity diffusion layer. Here, in a region where the floating gate 9 and control gate 15 are overlapped, the control gate 5 can be disposed either under or over the floating gate 9a similarly to the third embodiment. Here, the control gate 5 does not cover the entire region of the floating gate 9 similarly to the third embodiment.

Similarly to the structure shown in FIG. 6 of the first embodiment, the barrier layer 15 of this embodiment can be also disposed only in a region adjoining a connecting region 9c of the floating gate 9. Here, the connecting region 9c is located between the transistor region 9b and the region 9a overlapping the control gate 5. This structure can be practical since the region adjoining the connecting region 9c shares a large portion of the area surrounding the floating gate 9 as explained in the first embodiment. In particular, when the control gate 5 formed of the poly-silicon is disposed over the floating gate 9, the region adjoining the connecting region 9c shares relatively much larger portion. This exhibits the same effects as in the first embodiment.

Figure 13:
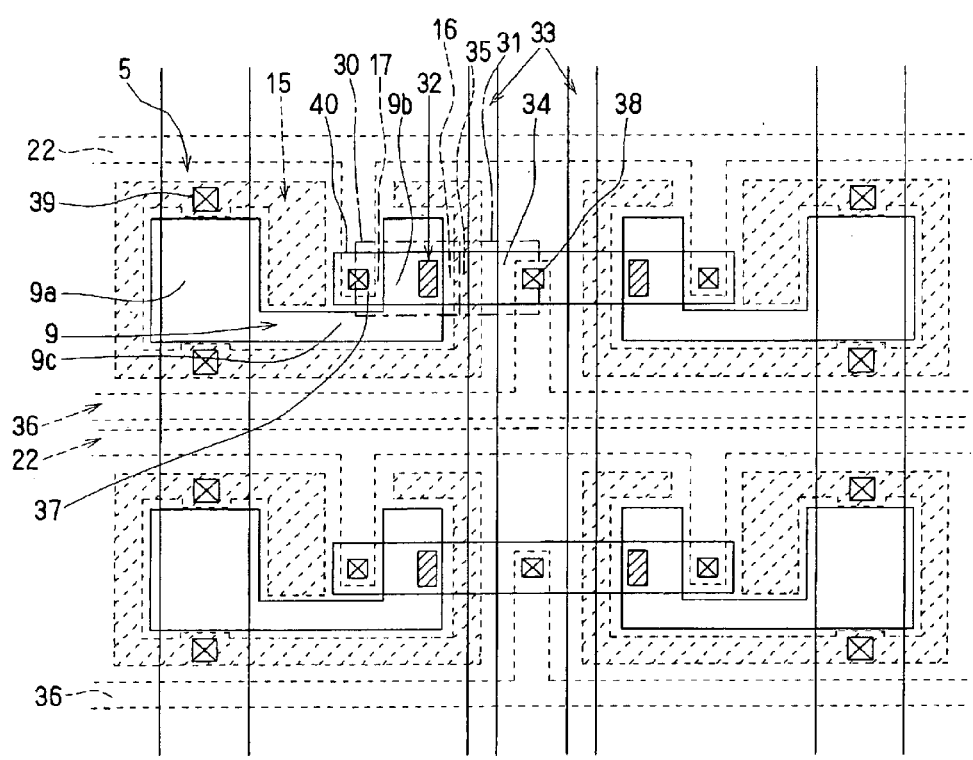
FIG. 13 is a plan view of an EEPROM according to a second example of the fourth embodiment.

The barrier layer 15 can be disposed differently while having the same effects. As shown in FIG. 13, the barrier layer 15 is connected with the control gate 5 via a contact 39, so that electric potential of the barrier layer 15 is fixed to that of the control gate 5.

Figure 14:
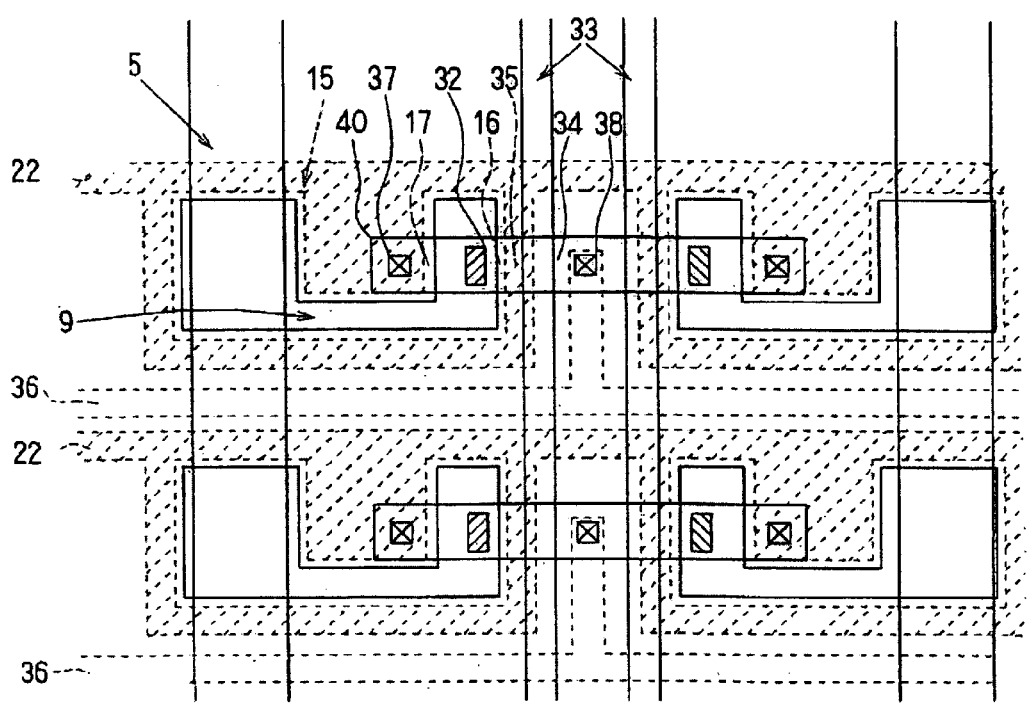
FIG. 14 is a plan view of an EEPROM according to a third example of the fourth embodiment.

As shown in FIG. 14, the barrier layer pattern is formed by combining between the barrier layer 15 and source line 22 shown in FIG. 12, so that the electric potential of the barrier layer 15 is fixed to that of the source line 22. Here, since the source line 22 is used as the barrier layer 15, the floating gate 9 is entirely surrounded by the barrier layer 15.

Figure 15:
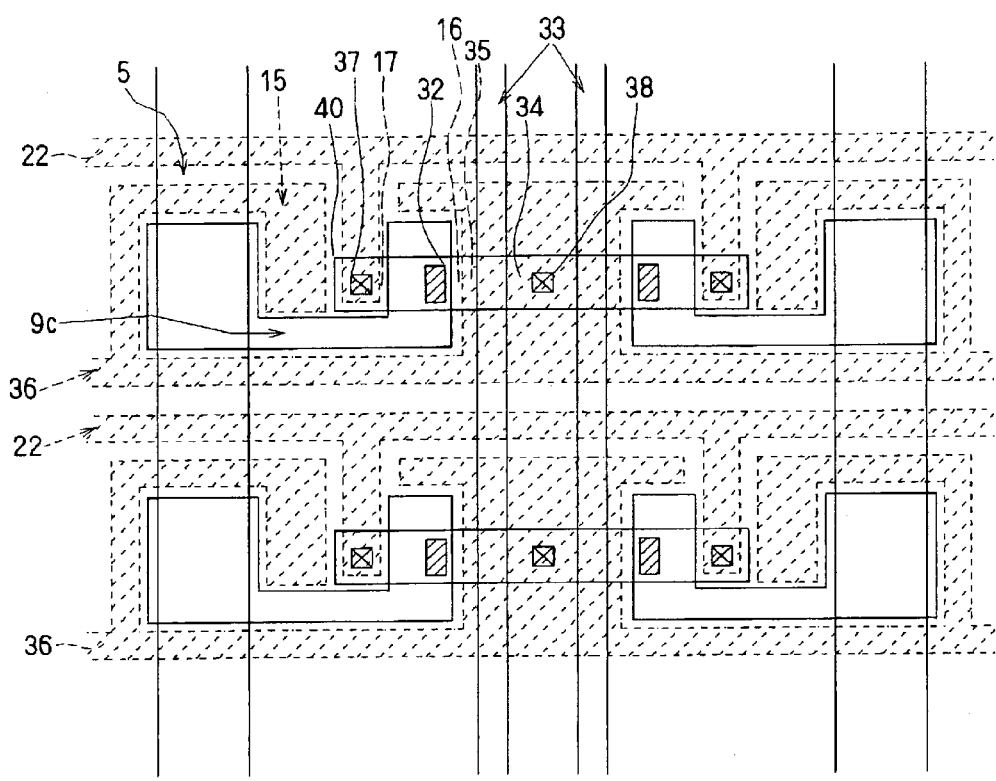
FIG. 15 is a plan view of an EEPROM according to a fourth example of the fourth embodiment.

As shown in FIG. 15, the barrier layer pattern is formed by combining between the barrier layer 15 and bit line 36 shown in FIG. 12, so that the electric potential of the barrier layer 15 is fixed to that of the bit line 36.

Figure 16:
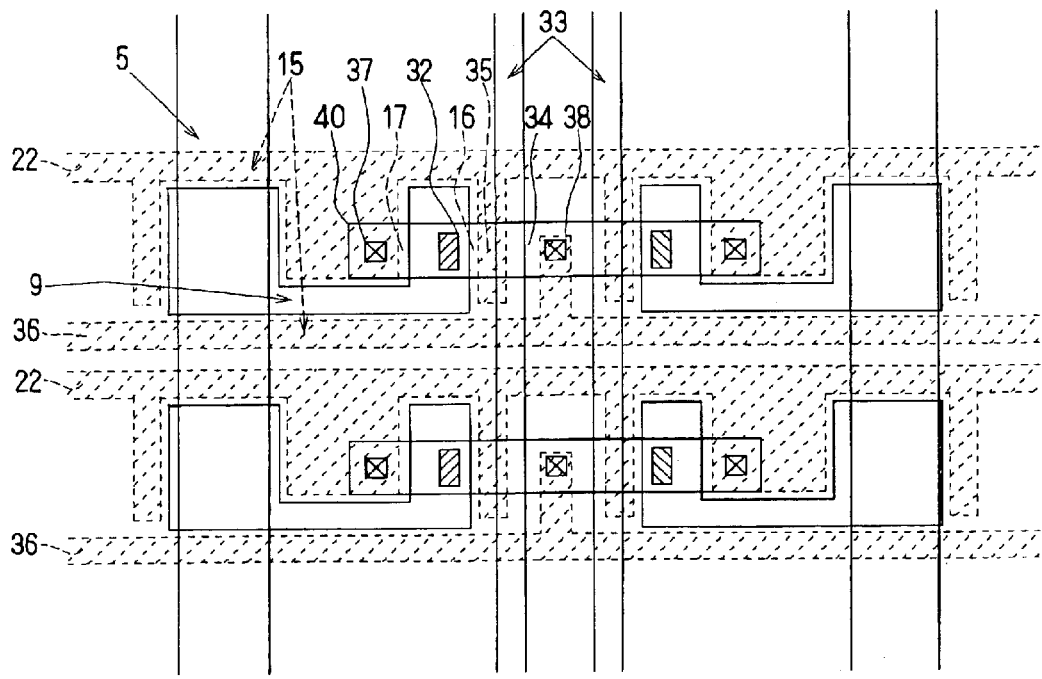
FIG. 16 is a plan view of an EEPROM according to a fifth example of the fourth embodiment.
Figure 17:
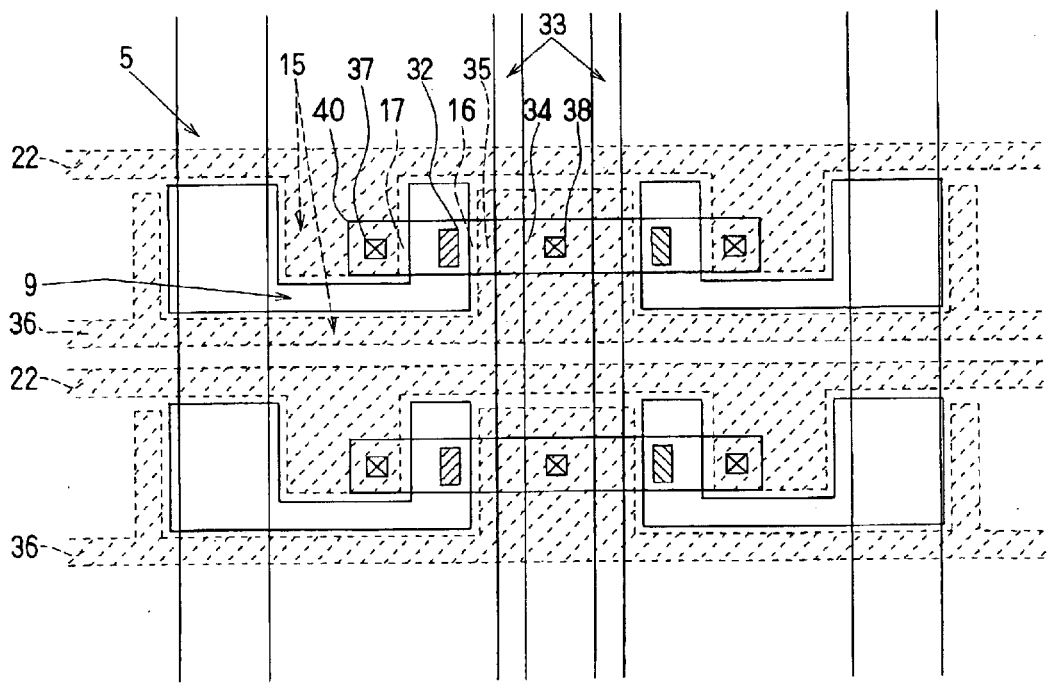
FIG. 17 is a plan view of an EEPROM according to a sixth example of the fourth embodiment.
Figure 18A:
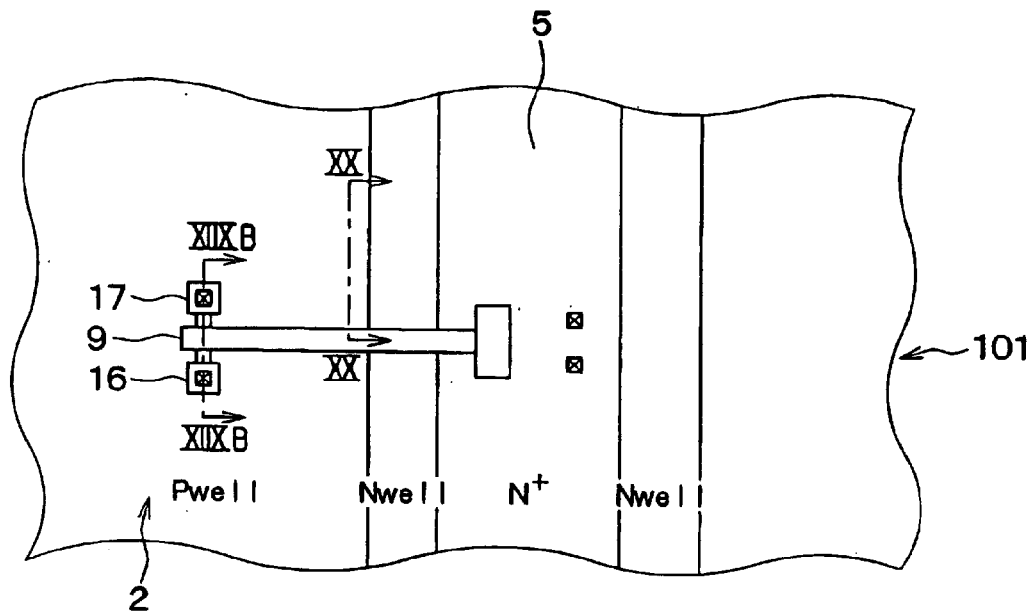
FIG. 18A is a plan view of an EPROM of the prior art.
Figure 18B:
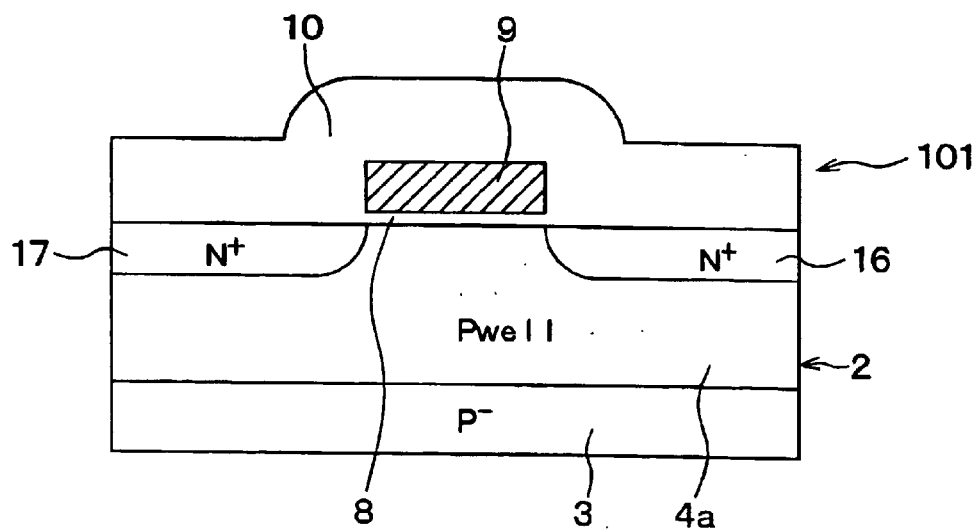
FIG. 18B is a sectional view of the EPROM taken a line XIIXB—XIIXB in FIG. 18A.

As shown in FIGS. 16 and 17, the barrier layer pattern is formed with two combinations. The first is between a part of the barrier layer 15 shown in FIG. 12 and the source line 22, and the second is between the other part of the barrier layer 15 shown in FIG. 12 and the bit line 36.

As shown in FIGS. 14 through 17, when the electric potential of the barrier layer 15 is fixed to that of the source line 22 or the bit line 36, a space between the barrier layer 15 and the source line 22 or the bit line 36 is unnecessary. Fixing the electric potential of the barrier layer 15 thus leads to a smaller cell size in comparison to isolating the barrier layer 15.

What is claimed is:

1. A non-volatile semiconductor storage device, provided with a semiconductor substrate, a control gate formed of a diffusion layer within the semiconductor substrate so as to form a single-layer gate structure, and a floating gate, for storing a plurality of data that are erasable by ultra-violet irradiation, the storage device comprising:

an isolating film formed on the floating gate; and a conductive layer, formed on the isolating film, for suppressing variation of electric potential in the floating gate, wherein the conductive layer is formed over an area that surrounds the floating gate, while the conductive layer is not formed over an area that covers the floating gate.

2. A non-volatile semiconductor storage device according to claim 1, further comprising:

an upper isolating film formed on and over the isolating film, wherein the conductive layer is formed between the isolating film and the upper isolating film.

3. A non-volatile semiconductor storage device according to claim 1, wherein the floating gate has a perimeter formed with a plurality of edges, and wherein the conductive layer is formed over an area facing, relative to a top surface of the semiconductor substrate, edges excluding the shortest edge of the plurality of the edges of the floating gate.

4. A non-volatile semiconductor storage device according to claim 1, further comprising:

a source region and a drain region, both of which are formed within the semiconductor substrate, wherein the floating gate includes a first region, a second region, and a third region, wherein in the first region, the floating gate intersects with the control gate, wherein in the second region, the floating gate is disposed over an area between the source region and the drain region, wherein the third region connects between the first region and the second region, and wherein the conductive layer is formed over an area that adjoins the third region.

5. A non-volatile semiconductor storage device according to claim 1, wherein the conductive layer is disposed over an area that surrounds an entire perimeter of the floating gate.

6. A non-volatile semiconductor storage device according to claim 1, wherein, relative to a top surface of the semiconductor substrate, the conductive layer and the floating gate face each other at a distance between 0 $\mu$m and 2 $\mu$m.

7. A non-volatile semiconductor storage device according to claim 1, wherein the conductive layer is electrically isolated.

8. A non-volatile semiconductor storage device according to claim 1, wherein electric potential of the conductive layer is fixed.

9. A non-volatile semiconductor storage device according to claim 1, further comprising:

a lower isolating layer, wherein the floating gate includes a region where the floating gate intersects with the control gate, wherein the control gate is formed of poly-silicon that is formed on the semiconductor substrate, and wherein the control gate is disposed over the region via the lower isolating layer.

10. A non-volatile semiconductor storage device according to claim 1, further comprising:

a lower isolating layer, wherein the floating gate includes a region where the floating gate intersects with the control gate, wherein the control gate is formed of poly-silicon that is formed on the semiconductor substrate, and wherein the control gate is disposed under the region via the lower isolating layer.

11. A non-volatile semiconductor storage device having a semiconductor substrate, a control gate formed as a single-layer gate structure associated with a diffusion layer within the semiconductor substrate, and a floating gale, the semiconductor storage device for storing a plurality of data erasable by ultra-violet irradiation, the storage device comprising:

an isolating film formed on the floating gate; and a conductive layer, formed on the isolating film, for suppressing a variation of electric potential in the floating gate associated with the ultra-violet irradiation, wherein the conductive layer is formed over a first area surrounding the floating gate, and not formed over a second area covering the floating gate.

12. A non-volatile semiconductor storage device according to claim 11, further comprising:

an upper isolating film formed on and over the isolating film, wherein the conductive layer is formed between the isolating film and the upper isolating film.

13. A non-volatile semiconductor storage device according to claim 11, wherein a perimeter associated with the floating gate has a plurality of edges, one of the plurality of edges having a length shorter than the others of the plurality of edge, and wherein the conductive layer is formed over an area adjoining the others of the plurality of edges, and not formed over an area adjacent to the shortest one of the plurality or edges.

14. A non-volatile semiconductor storage device according to claim 12, further comprising:

a source region and a drain region, both of which are formed within the semiconductor substrate, wherein the floating gate includes a first region, a second region, and a third region, wherein in the first region, the floating gate intersects with the control gate, wherein in the second region, the floating gate is disposed over an area between the source region and the drain region, wherein the third region connects between the first region and the second region, and wherein the conductive layer is formed over an area adjoining the third region.

15. A non-volatile semiconductor storage device according to claim 11, wherein the conductive layer is disposed over an area surrounding an entire perimeter of the floating gate.

16. A non-volatile semiconductor storage device according to claim 11, wherein the vertical planes of the adjoining edges of the conductive layer and the floating gate are disposed with each other at a space between 0 $\mu$m and 2 $\mu$m.

17. A non-volatile semiconductor storage device according to claim 11, wherein the conductive layer is electrically isolated.

18. A non-volatile semiconductor storage device according to claim 11, wherein electric potential of the conductive layer is fixed.

19. A non-volatile semiconductor storage device according to claim 11, further comprising:

a lower isolating layer, wherein the floating gale includes a region where the floating gate intersects with the control gate, wherein the control gate is formed of poly-silicon that is formed on the semiconductor substrate, and wherein the control gate is disposed over the region via the lower isolating layer.

20. A non-volatile semiconductor storage device according to claim 11, further comprising:

a lower isolating layer, wherein the floating gate includes a region where the floating gate intersects with the control gate, wherein the control gate is formed of poly-silicon that is formed on the semiconductor substrate, and wherein the control gate is disposed under the region via, the lower isolating layer.

* * * * *